United States Patent [19]

Simms

[11] Patent Number: 4,884,275
[45] Date of Patent: Nov. 28, 1989

[54] LASER SAFETY SHUTOFF SYSTEM

[75] Inventor: Robert A. Simms, Phoenix, Ariz.

[73] Assignee: Murasa International, Long Beach, Calif.

[21] Appl. No.: 261,103

[22] Filed: Oct. 24, 1988

[51] Int. Cl.⁴ .............................................. H01S 3/10
[52] U.S. Cl. ........................................ 372/9; 372/38; 219/121.62
[58] Field of Search .................. 372/9, 38; 219/121.62

[56] References Cited

U.S. PATENT DOCUMENTS 4,561,440  12/1985  Kubo et al. ................... 219/121.62
4,720,621   1/1988  Langen .......................... 219/121.62

Primary Examiner—Léon Scott, Jr.
Attorney, Agent, or Firm—LaValle D. Ptak

[57] ABSTRACT

A safety light responsive shutoff switch is provided for a hand-held infrared laser light source to prevent irreparable eye damage to persons who may inadvertently look into the light exit opening of the laser light source while it is operating. This is accomplished by concentrically mounting normally-closed infrared light responsive photoelectric Darlington safety switches around the light exit end of the light source. Light reflected from the laser light source off an object intruding into the laser beam within a danger zone (typically zero inches to ten inches from the light exit opening) produces reflected light at the frequency of the laser light source of sufficient intensity to operate the photoelectric Darlington safety switch devices to turn off the power supply to the laser light source. Light reflected from objects which are outside of the danger zone is of insufficient intensity to operate the light responsive safety switches.

17 Claims, 1 Drawing Sheet

LASER SAFETY SHUTOFF SYSTEM

RELATED APPLICATION

This application is related to the commonly assigned, copending application, Ser. No. 07/208,457, filed June 20, 1988.

BACKGROUND

The above-identified co-pending application is directed to a portable solid state light emitting device employing light emitting diodes (LEDs) and laser diodes (LDs). The device disclosed in that application is an infrared zoom illuminator capable of providing either a narrowly focused beam of infrared light energy from the light source or for illuminating a relatively large area, depending upon the manner of operation of the focusing element in the device. Since the light emitted from the infrared light source is not visible to the naked eye, a person who is not wearing infrared night vision equipment cannot determine whether the device is operating. Provisions may be made to provide an on/off indicator light on the device which emits light in the visible wavelength range. This still, however, does not satisfactorily tell an operator if the infrared laser light source is burned out or otherwise inoperative.

Even though the infrared light is invisible, there is a strong temptation on the part of some users of such devices to turn them around and look into them to see if the device is on or off. The intensity of laser light in the infrared region produced by devices of the type disclosed in the above-identified co-pending application, or by other laser light sources, is such that even a momentary exposure of the eye to such light may cause irreparable damage to the retain resulting in partial or total, permanent blindness. Consequently, such laser light sources typically are provided with warning labels on them to warn users never to look into the light source or to point the device at someone who is in near proximity to it. Even so, a substantial danger of accidental blinding still exists.

The above-noted dangers are described in safety manuals given to operators of such devices. A great danger for permanent eye damage from devices of the type disclosed in the above-identified co-pending application occurs in what is known as Class III laser beam intrusion. Class IV devices are also a source of danger. Typically, this is for intrusion in the zero to ten inch range (or slightly beyond). By intrusion, it is meant that an object (such as the eye of the operator of the device) is placed within the emitted beam of laser light at a distance which is equal to or less than the intrusion distance. For Class III beam intrusion, this "danger zone" range is a maximum of ten inches, obviously extending down to zero inches.

Consequently, it is desirable to provide a safety shutoff system to turn off the laser light source automatically if any one or anything intrudes into the laser beam within the danger zone distance.

SUMMARY OF THE INVENTION

It is an object of this invention to provide an improved laser safety shutoff system.

It is another object of this invention to provide an improved laser safety shutoff switch system for use with any laser device.

It is an additional object of this invention to provide an improved laser safety shutoff switch system for use with laser light sources operating in any region of the spectrum, including the infrared region.

It is a further object of this invention to provide an improved light responsive laser safety shutoff switch system capable of responding to light reflected from a laser light source from objects which intrude into the laser beam within a pre-established danger zone distance.

In accordance with a preferred embodiment of this invention, an infrared illuminator includes a housing with a light exit opening in it and an infrared laser light source mounted in the housing. The power supply is provided with a control switch for selectively interconnecting and disconnecting the light source and the power supply. In addition, a normally closed, light responsive, safety switch is located in the housing and is connected in series circuit with the light source and the power supply for opening such circuit in response to light of a predetermined wavelength impinging on the light responsive safety switch means. In a more specific embodiment, the laser light source emits light having wavelengths in the infrared region; and the light responsive safety switch is responsive to light of wavelengths in the same infrared region reflected from objects intruding into the beam of light from the light source within a pre-established distance from the light source.

DETAILED DESCRIPTION

Figure 1:
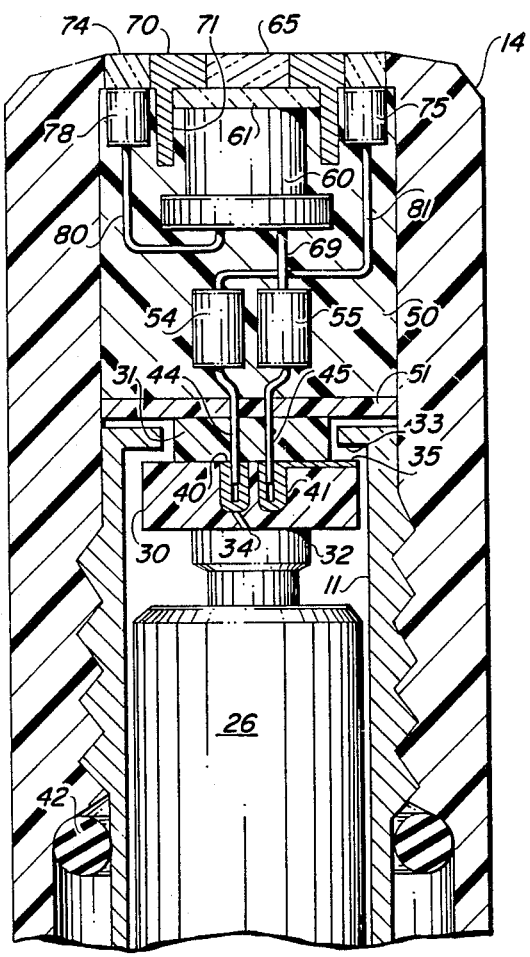
FIGS. 1 and 2 of the drawing are partial cross-sections of a preferred embodiment of the invention showing first and second conditions of operation thereof.

Reference now should be made to the drawing in which the same reference numbers are used throughout the different figures to designate the same components. In addition, the specification of the above-identified co-pending application, Serial No. 07/208,457 also is incorporated herein by reference, and the same reference numbers are used in FIGS. 1 and 2 which correspond to the reference numbers for the same components as disclosed in that co-pending application.

Figure 2:
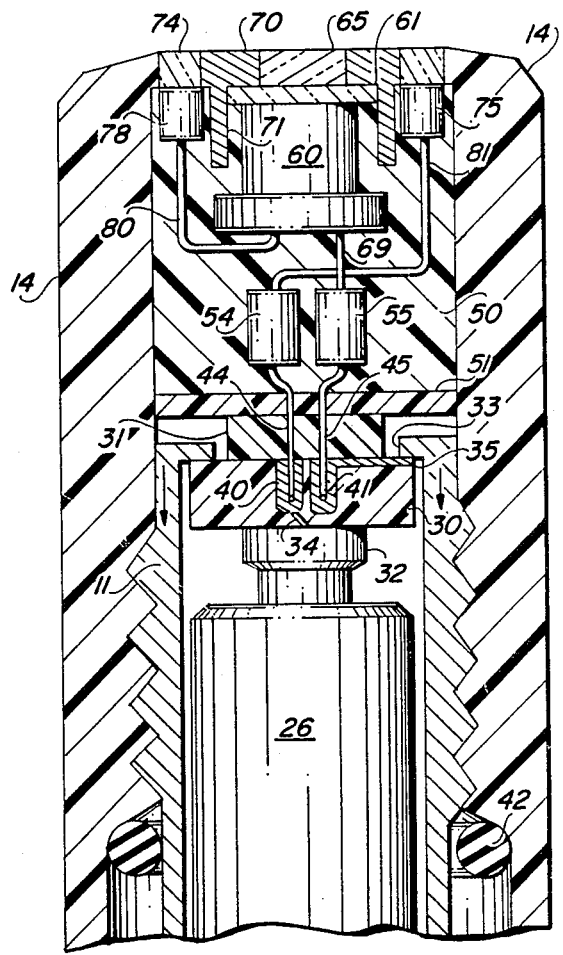
Figure 3:
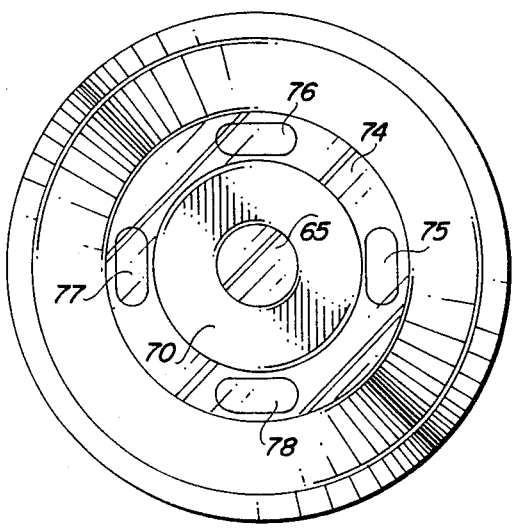
FIG. 3 is a top view of the embodiment shown in FIGS. 1 and 2.

FIGS. 1 and 2 are similar to FIGS. 4B and 4C, respectively, of the above-identified co-pending United States Application. These figures depict the forward end of a portable laser infrared illuminator which has been modified in accordance with a preferred embodiment of this invention.

The main body portion of the device is made of metal. Batteries, one of which (26) is shown in FIGS. 1 and 2, are placed in the main body portion 11 to act as a power supply for the device. This is done in a manner not shown in FIGS. 1 and 2 (but described in detail in applicant's co-pending application). The battery 26 is urged upwardly, as viewed in FIGS. 1 and 2, against an electrical connector block 30 made of insulating material. This connector block has a projection or extension 31 on it which extends upwardly into a circular opening formed by the internal diameter of an inwardly turned shoulder 33 on the end of the housing 11. This shoulder 33 limits the movement of the battery 26 and the block 30 when they are pressed upwardly, as viewed in FIGS. 1 and 2, to the position shown in FIG. 2.

Without placement of a cylindrical outer portion or head 14 made of insulating material, a spring (not shown) urges the battery 26 into physical and electrical contact with a conductive contact member 32 which engages the end contact on the battery 26. When the head 14 is not in place, the connector block 30/31 is moved to the position shown in FIG. 2. This causes the upper surface of the block 30 to physically engage the lower surface of the shoulder 33. This in turn causes contact between a conductive metal connector tab 35 and the shoulder 33 of the metal housing 11. The connector tab 35 also is electrically interconnected with a socket 41 to complete an electrical connection from the socket 41 through the tab 35 to the shoulder 33 of the metal housing 11. Another electrical socket 40 is interconnected by a wire or conductor 34 to the contact 32, which engages the end of the battery 26.

The assembly is completed in the same manner described in applicant's co-pending application by threading the head 14 onto the end of the housing 11. Mating threads of a relatively coarse pitch are provided on the outside of the body 11 and the inside of the head 14, respectively. A rubber or neoprene O-ring 42 fits over the body 11 and engages the open end of the head 14 to provide a water-tight seal between the two parts, as shown in both FIGS. 1 and 2. An encapsulated electronics package housing 50 is placed within the head 14, and the package 50 has a base plate 51 on it through which a pair of male electrical contact pins 44 and 45 extend. These pins are located to fit within, and make electrical contact with, the sockets 40 and 41, respectively.

The encapsulated electronics package 50 is loosely held within the head 14. When the pins 44 and 45 are inserted into the sockets 40 and 41, the head 14 is permitted to rotate about the housing 50, which is prevented from rotation by the connector pins 44 and 45. This causes it to remain in the orientation shown in FIGS. 1 and 2 with respect to the housing 11.

A pair of current limiting resistors 54 and 55 also are mounted in or encapsulated within the housing 50. The lower end of these resistors are connected to the contact pins 44 and 45, respectively. The upper end of the resistor 54 (as viewed in FIGS. 1 and 2) is connected in a series circuit through a connector 81 with four photoelectric Darlington switch devices 75, 76, 77 and 78 connected together in series. The last of these, switch 78, is connected through a connector 80 to the terminal on one side of an infrared laser diode 60.

The diode 60 may be of any suitable type (such as GaAlAs or GaAs, with a wavelength of 780 nm). This laser diode produces power on the order of five (5) milliwatts or more, and produces a laser beam (in the infrared red wavelength spectrum) having a diameter of approximately 1.5 microns or less in size. The orientation of the light emitted from the laser diode 60 is such that the output beam is centered on the axis of the housing 11 and the head 14. The other side of the laser diode 60 is connected through a connector 69 to the upper terminal of the resistor 55.

The on/off switching operation to connect power from the battery 26 through the above described circuit and back again is effected through the connector tab 35 and the underside of the shoulder 33. These elements are diagrammatically depicted in the circuit diagram of FIG. 4. FIG. 1 illustrates the operation of this switch 33/35 when it is open, and FIG. 2 illustrates the closed position of this switch. The opening and closing of the switch is effected by the relative rotation of the head 14 with respect to the housing 11 in the manner described in greater detail in the above-identified co-pending application.

To ensure that no visible light is emitted from the device, a filter 61 also may be cemented into a circular opening in the upper end of the housing 50 in contact with the light emitting end of the laser diode 60. The characteristics of the filter 61 are such that it passes wavelengths of light in the infrared region. If visible light leakage is not considered detrimental for some applications, the filter 61 could be eliminated, although in most cases it is desirable to provide the filter 61.

The head 14 has a relatively large circular hole through it at the upper end, as is clearly shown in FIGS. 1 and 2. Three different elements are mounted in and cemented in place in this hole. At the center is a suitable infrared transparent lens 65. This lens then is secured to an opaque (both to visible and infrared light) shield ring 70 which has a downward depending flange 71 on it extending around the laser diode 60. This ensures that no light emitted from the diode 60 passes through either the filter 61 or lens 65 laterally outwardly into other parts of the device shown. A third concentric circular element in the form of an optically clear ring 74 for reflected infrared energy is located to directly overlie the photo responsive parts of the photoelectric Darlington switches 75, 76, 77 and 78. Thus, the ring 74 transmits reflected infrared energy through the ring to the photoelectric Darlington switches 75 through 78.

The lens 65, opaque guard ring 70, and infrared transparent ring 74, all are cemented in place in the end of the housing 14 and rotate with it. The other elements shown within the housing 50 rotate with or remain with the portion 11 of the device.

The photoelectric Darlington switches 75 through 78 are selected from suitable commerically available silicon detectors and are configured to be responsive to the wavelengths to be detected. Typically, these wavelengths are the same wavelengths which are transmitted by the laser 60. In the example under consideration, the laser 60 transmits light of infrared wavelengths. Consequently, the selection of the particular type of photo responsive Darlington switch depends upon the wavelength of the infrared light transmitted by the laser 60. For the near infrared region (up to 1.5 microns), the photo responsive portion of the Darlington switches 75 through 78 preferably is Indium Antimonide (InSb) or some other suitable silicon or Gallium compound. For infrared light from the laser 60 in the mid infrared range (up to 5 microns), Indium Antimonide detectors or detectors made of a lead salt or doped silicon may be used. For the far infrared wavelengths (up to 12 microns and beyond), extrinsic silicon or Mercury Cadmium Telluride compounds are preferred. All of these photo responsive compounds presently exist, and the selection of the particular one for use as the photo responsive portion of the Darlington switches 75 through 78 depends upon the wavelength of the light transmitted from the laser 60.

Figure 4:
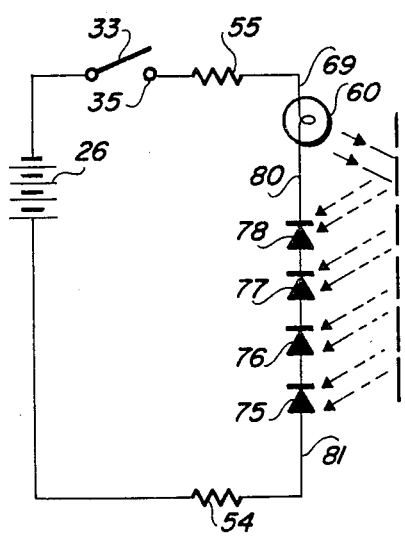
FIG. 4 is a circuit diagram of the circuit interconnections of various components shown in the embodiment in FIGS. 1 through 3.

The device operates, as diagrammatically illustrated in FIG. 4, to prevent unintentional injury from occuring by turning off the laser 60 instantaneously any time there is a beam intrusion within a pre-established distance from the upper end of the device shown in FIGS. 1 and 2. Typically, this distance is less than twenty (20) inches, and preferably it is between zero inches and ten inches. If anyone or anything intrudes into the laser beam emitted from the laser diode 60 within this zone, called the danger zone, the photo electric sensors 75 through 78 operate to open the power circuit to the laser diode 60, turning it off. This is a nearly instantaneous operation, taking place in approximately a few microseconds. The time the switches 75 through 78 remain operated to open the circuit may be established by a built-in time delay or by means of a separate reset switch (not shown).

The operation is such that whenever an intrusion within the danger zone occurs, a portion of the light emitted from the laser diode 60 through the lens 65 reflects off the intruding object (shown as the dotted line on the right hand side of FIG. 4) and is reflected through the ring 74 onto one or more of the photo electric Darlington switches 75 through 78. When light of sufficient intensity impinges upon any one of these diodes, the Darlington switch controlled by it opens, thereby breaking the power circuit between the battery 26 and the laser diode 60. The amount of light to required to do this is selected by the trigger level of the Darlington switch, the infrared light transmission properties of the ring 74 and the intensity of the light emitted from the diode 60. These varying parameters may be emperically determined or calculated to cause the operation of the photo Darlington switch devices 75 through 78 to occur whenever such an intrusion into the danger zone occurs. It is readily apparent that for any target (whether it is a person or some other physical object) which is encountered by the beam from the diode 60 outside the danger zone, insufficient light is reflected back to the photo responsive Darlington switches 75 through 78 to operate them. Consequently, these normally closed switches remain closed; and the device operates in the manner described in detail in the above-identified co-pending application.

The device which is shown and which has been described above effectively operates to shut off the laser diode light source before any permanent damage can occur to the eye of a person in the event that an intrusion, in fact, is the eye of a person located within the danger zone and looking at the lens 65 of the device. The foregoing description of the preferred embodiment of the invention should be taken as illustrative only and not as limiting of the invention. Various changes and modifications will occur to those skilled in the art without departing from the true scope of the invention as defined in the appended claims.

I claim:

1. A laser illuminator including in combination:
   a housing having a light exit opening therein;
   a laser light source mounted in said housing;
   a power supply located in said housing;
   control switch means for selectively interconnecting and disconnecting said laser light source and said power supply; a transmitting lens mounted in said housing between said light source and the light exit opening in said housing: a receiving lens concentrically mounted with respect to said transmitting lens in said housing adjacent said transmitting lens for receiving light of a predetermined wavelength:
   an opaque shield between said transmitting lens and said receiving lens to prevent light emitted from said light source from directly impinging upon said receiving lens and
   normally closed, light responsive, safety switch means mounted in said housing behind said receiving lens means to receive light reflected from said light source onto said receiving lens means by an object and connected in series circuit with said light source and said power supply for opening said series circuit in response to light of a predetermined intensity impinging thereon.

2. The combination according to claim 1 wherein the wavelength of said light corresponds to the wavelength of light emitted by said laser light source.

3. The combination according to claim 2 wherein said laser light source is a solid state laser light source, emitting light having wavelengths in the infrared range and said wavelength comprises a wavelength in said same infrared range.

4. The combination according to claim 3 wherein said light responsive safety switch means comprise photoelectric Darlington switch means.

5. The combination according to claim 4 wherein said housing is a substantially cylindrical housing, with the light exit opening comprising a circular opening located substantially in the center of one end thereof.

6. The combination according to claim 5 wherein said light responsive safety switch means comprise a plurality of such safety switch means substantially concentrically disposed about said transmitting lens behind said receiving lens means, said plurality of safety switch means being interconnected in series circuit with one another.

7. The combination according to claim 6 wherein said power supply is a battery power supply.

8. The combination according to claim 7 wherein said photo electric Darlington switch means is responsive to reflected infrared light produced by a Class III laser beam intrusion in the range from zero inches to ten inches.

9. The combination according to claim 1 wherein said light responsive safety switch means comprise photoelectric Darlington switch means.

10. The combination according to claim 9 wherein said photoelectric Darlington switch means is responsive to reflected laser light produced by a Class III laser beam intrusion in the range from zero inches to ten inches.

11. The combination according to claim 1 wherein said housing is a substantially cylindrical housing, with the light exit opening comprising a circular opening located substantially in the center of one end thereof.

12. The combination according to claim 1 wherein said light responsive safety switch means comprise a plurality of such safety switch means substantially concentrically disposed about said transmitting lens behind said receiving lens means, said plurality of safety switch means being interconnected in series circuit with one another.

13. The combination according to claim 1 wherein said light responsive safety switch means comprises photo Darlington switch means responsive to reflected laser light produced by a Class III laser beam intrusion in the range from zero inches to ten inches.

14. The combination according to claim 1 wherein said power supply is a battery power supply.

15. A safety shutoff system including in combination:
   a housing having a light opening therein; a first lens mounted in said light opening in said housing:
   an electro-optic device mounted in said housing behind said first lens;
   a power supply located in said housing;
   control switch means for selectively interconnecting and disconnecting said electronic device and said power supply; a receiving lens concentrically mounted in said housing with respect to said first lens: an opaque shield between said first lens and said receiving lens and normally closed, light responsive, safety switch means mounted in said housing behind said receiving lens means to receive light impinging thereon and connected in series circuit with said electronic device and said power supply for opening said series circuit in response to light of a predetermined intensity impinging thereon.

16. The combination according to claim 15 wherein said light responsive safety switch means comprise photoelectric Darlington switch means.

17. The combination according to claim 16 wherein said light responsive safety switch means comprise a plurality of such safety switch means substantially concentrically disposed about said first lens behind said receiving lens means, said plurality of safety switch means being interconnected in series circuit with one another.

* * * * *